United States Patent
Benesch et al.

(10) Patent No.: US 11,474,164 B2
(45) Date of Patent: Oct. 18, 2022

(54) DETERMINING A FUNCTION OF A CAPACITOR OF A PASSIVE FILTER CIRCUIT

(71) Applicant: Siemens Aktiengesellschaft, Munich (DE)

(72) Inventors: Norbert Benesch, Heroldsberg (DE); Franz Bauer, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 115 days.

(21) Appl. No.: 17/254,143

(22) PCT Filed: May 16, 2019

(86) PCT No.: PCT/EP2019/062585
§ 371 (c)(1),
(2) Date: Dec. 18, 2020

(87) PCT Pub. No.: WO2019/242946
PCT Pub. Date: Dec. 26, 2019

(65) Prior Publication Data
US 2021/0270913 A1  Sep. 2, 2021

(30) Foreign Application Priority Data

Jun. 21, 2018  (EP) .................................. 18179098

(51) Int. Cl.
*G01R 31/64* (2020.01)
*G01R 27/26* (2006.01)
*H03H 7/01* (2006.01)

(52) U.S. Cl.
CPC ......... *G01R 31/64* (2020.01); *G01R 27/2605* (2013.01); *H03H 7/0115* (2013.01)

(58) Field of Classification Search
CPC ........ G01R 31/00; G01R 31/50; G01R 31/64; G01R 27/00; G01R 27/02; G01R 27/26;
(Continued)

(56) References Cited

U.S. PATENT DOCUMENTS 8,362,784 B2 * 1/2013 Takeuchi ........... H01H 33/6662
324/551
9,819,255 B2  11/2017 Patel et al.
(Continued)

FOREIGN PATENT DOCUMENTS

| EP | 2390997 A2 | 11/2011 |
| EP | 3232217 A1 | 10/2017 |
| WO | WO 2014098800 A1 | 6/2014 |

OTHER PUBLICATIONS

PCT International Search Report and Written Opinion of International Searching Authority dated Aug. 7, 2019 corresponding to PCT International Application No. PCT/EP2019/062585 filed May 16, 2019.

*Primary Examiner* — Hoai-An D. Nguyen
(74) *Attorney, Agent, or Firm* — Henry M. Feieresisen LLC

(57) ABSTRACT

A method for determining a function of a capacitor of a passive filter circuit, which partially reduces line-conducted interference of an electrical device electrically coupled to a power supply system via the passive filter circuit. The passive filter circuit comprises the capacitor having a predefined capacitance value and a choke having a predefined inductance value. An electric capacitor voltage on the capacitor is detected. A connection voltage of the electrical device is detected. Spectral components are determined for the capacitor voltage and the connection voltage. The function of the capacitor is determined by analysing the spectral (Continued)

components in consideration of the inductance value of the choke by a statistical processing operation.

12 Claims, 10 Drawing Sheets

(58) Field of Classification Search
CPC ...... G01R 27/2605; H02H 7/00; H02H 7/001; H02H 7/003; H02H 7/005; H02H 9/00; H02H 9/005; H02H 9/007; H03H 7/00; H03H 7/01; H03H 7/0115; H02J 3/00; H02J 3/38; H02J 3/381; H02J 2300/00; H02J 2300/10; H02M 1/00; H02M 1/12; H02M 1/126
USPC .......................................... 324/500, 537, 548
See application file for complete search history.

(56) References Cited

U.S. PATENT DOCUMENTS

| | | | |
|---|---|---|---|
| 10,564,210 B2* | 2/2020 | Yoshida | G01R 31/64 |
| 2011/0292696 A1* | 12/2011 | Xiao | H02M 5/4585 |
| | | | 324/548 |
| 2012/0271572 A1* | 10/2012 | Xiao | H02M 1/126 |
| | | | 702/58 |
| 2022/0069580 A1* | 3/2022 | Nielsen | F03D 7/0284 |

* cited by examiner

DETERMINING A FUNCTION OF A CAPACITOR OF A PASSIVE FILTER CIRCUIT

CROSS-REFERENCES TO RELATED APPLICATIONS

This application is the U.S. National Stage of International Application No. PCT/EP20191062585, filed May 16, 2019, which designated the United States and has been published as International Publication No. WO 20191242946 Aland which claims the priority of European Patent Application, Serial No. 18179098.1, filed Jun. 21, 2018, pursuant to 35 U.S.C. 119(a)-(d).

BACKGROUND OF THE INVENTION

The invention relates to determining a function of a capacitor of a passive filter circuit, which at least partially reduces line-conducted interferences of an electrical device coupled electrically to a power supply system via the filter circuit, to which end the filter circuit comprises at least one capacitor having a predefined capacitance and at least one choke having a predefined inductance value, wherein an electrical capacitor voltage is detected at least indirectly on the at least one capacitor. The invention further relates to a determination facility for determining a function of a capacitor of a passive filter circuit, which is embodied to at least partially reduce line-conducted interferences of an electrical device coupled electrically to a power supply system via the filter circuit, to which end the filter circuit comprises at least the one capacitor having a predefined capacitance and at least one choke having a predefined inductance value, wherein the determination device is embodied to detect, at least indirectly, an electrical capacitor voltage on the at least one capacitor. Finally the invention also relates to an electrical device with a connection for electrical coupling to a power supply system, to a passive filter circuit, which is connected to the connection and via which the electrical device is able to be coupled electrically to the power supply system, wherein the passive filter circuit is embodied to at least partially reduce line-conducted interferences, to which end the filter circuit comprises at least one capacitor having a predefined capacitance value and at least one choke having a predefined inductance value, and a determination device for determining a function of the at least one capacitor of the passive filter circuit, wherein the determination device is embodied to detect, at least indirectly, an electrical capacitor voltage on the at least one capacitor.

The operation of electrical devices on power supply systems demands that effects of the electrical devices on the power supply systems are restricted, so that the system can be guaranteed to operate normally.

An electrical device is in particular an electrical apparatus, an electrical drive facility, for example an electrical inverter, in particular a system inverter, a power converter, for example a DC/DC converter, but also an electrical machine, a wind turbine, a photovoltaic installation, an electrical generator driven by an internal combustion engine and/or the like.

In order to be able to guarantee that the electrical device operates normally on the power supply system, requirements in respect of the effects on the power supply system or with regard to an electromagnetic compatibility are to be complied with. Such requirements are for example also specified by law or through standards, for example in the guideline 2014/30/EU about electromagnetic compatibility, the law for Germany on electromagnetic compatibility of means of operation, but also through standards such as, for example, from the EN 61000 series and/or the like.

Fundamentally electromagnetic compatibility means the absence of effects on other devices and other electrical devices, which lead in these to undesired or even desired interferences, in particular radio interferences in electrical or electronic operating media, for example as a result of electrical, magnetic or also electromagnetic fields and processes. In particular this also includes influencing as a result of electrical currents and/or electrical voltages.

In particular with regard to line-conducted interferences, especially with regard to line-conducted radio interferences, to ensure electromagnetic compatibility, an appropriate construction and an appropriate design is important. To this end the electrical devices frequently comprise filter circuits, in particular passive filter circuits, by means of which the requirements for electromagnetic compatibility, in particular with regard to line-conducted radio interferences, can be complied with. The filter circuits can also be provided as separate modules or devices, wherein the electrical device is then coupled electrically via the separate filter circuit to the power supply system.

The power supply system is a facility that serves in particular to distribute electrical power between electrical devices connected thereto. It can for example also serve to electrically couple just a single electrical device, for example a power converter, to an electrical power source such as an electrical machine, an electrical power store, for example an accumulator arrangement and/or the like. The power supply system is preferably a public power supply system. It can however also be an island system or the like. The power supply system can however also comprise one or more electrical machines or at least be formed by them. The term "power supply system" therefore in particular also comprises an arrangement in which for example an electrical machine is connected to a power converter, wherein the electrical machine can be assigned to the power supply system and the power converter to the electrical device.

An important area of application relates to active system inverters as power converters or as electrical devices. Active system inverters typically serve to exchange power between an alternating current system and a direct current system or a direct current link circuit. The alternating current network can be formed by the power supply system. Active system inverters are therefore of great importance both for drive systems, in which for example a motor inverter uses a regulated dc voltage of the dc link circuit as its input, and also increasingly for power generation and power storage, for example when the dc link circuit is connected to a battery, for example in the manner of a high-voltage battery or the like. As a rule the battery is embodied as an accumulator. In this regard the reader is referred to the IEC TS 62578 standard for further information.

An active system inverter can be embodied in particular to make possible an exchange of power between the alternating current network and the dc link circuit in a bidirectional direction. It is thus possible, with this type of active system inverter, to convey electrical power from the alternating current system or the power supply system to the dc link circuit as well as vice versa. This for example enables a drive facility provided on the dc link circuit side to be supplied with electrical power from the power supply system. Over and above this it is also possible to convey electrical power, which is provided by the drive facility at the dc link circuit, into the power supply system, for example when an electrical machine of the drive facility is operated as a generator, in order for example to provide a braking effect, or also when electrical power stored in the battery or provided by means of photovoltaic modules is to be fed into the power supply system. Above and beyond this the active system inverter can also be designed to be able to provide no-load power on the ac voltage side. This also enables the active system inverter to be used on the power supply system side or on the ac voltage side to be able to at least partially compensate for no-load power.

Electrical devices use power converters such as for example inverters in a very wide diversity of forms. Today power converters in the form of so-called static power converters are used, meaning that, unlike dynamic power converters, they do not have any mechanically movable, in particular no rotatable parts for the purpose of power conversion. Static power converters are embodied as a rule as clocked electrical power converters and to this end have at least one converter inductance and at least one switching element, which are connected to one another in a suitable manner and are electrically coupled in a suitable manner for example to the power supply system, so that by operating the switching element in a suitable switching mode, the desired conversion function of the power converter can be achieved.

A switching element in the context of this publication is preferably a controllable electronic switching element, for example a controllable electronic semiconductor switch such as a transistor, a thyristor, combination circuits thereof, preferably with parallel-switched freewheeling diodes, a Gate Turn Off Thyristor (GTO) an Insulated Gate Bipolar Transistor (IGBT), combinations thereof or the like. Fundamentally the switching element can also be formed by a field effect transistor, in particular a Metal Oxide Semiconductor Field Effect Transistor (MOSFET).

To provide the desired power conversion functionality the at least one switching element is operated in switching mode. With regard to a semiconductor switch as a type of transistor this means that in a switched-on switching state a very small electrical resistance is provided between the gates of the transistor forming a switching path, so that a high current flow is possible with a very small residual voltage. In a switched-off switching state on the other hand the switching path of the transistor is high-resistance, meaning that it provides a high electrical resistance, so that even with a high electrical voltage present on the switching path, essentially no or just a very small, in particular negligible, current flow is present. This differs from a linear mode in transistors, which however are as a rule not used in clocked power converters.

The at least one switching element is coupled to a control unit. With a number of switching elements for a power converter, all of the number of switching elements are preferably coupled to the control unit. The coupling is preferably embodied in such a way that each of the switching elements can be controlled individually. The control unit can be embodied as an electronic circuit, which provides corresponding control signals for the at least one switching element, so that the desired switching operation of the switching element can be realized. The electronic circuit, as well as electronic components for predeterminable provision of the control signals, can also comprise at least one program-controlled computing unit in order to be able to provide the desired function of the control unit. Naturally the control unit can also consist exclusively of the computing unit.

If the power converter is formed by an active system inverter, the active system inverter, for realizing the power conversion function, can comprise one or more half bridge circuits consisting of switching elements, which can be connected to one another in the manner of a B6 bridge circuit or the like, for example. By operating the switching elements in switching mode, in which two or also more different switching states can be realized, using a pulse duty factor, an almost continuous curve of a corresponding voltage, for example of an ac voltage, can be approximated. Depending on the technology and power used, a clock rate can amount to between a few 100 Hz and a few 100 kHz, preferably typically around 2 kHz to around 20 kHz.

The ac voltage of an active system inverter can thus, in addition to a basic frequency, namely for example a system frequency of the power supply system and also where necessary also system harmonics, also comprise spectral components in the range of the clock rate, in particular inclusive of sidebands, and their multiples. The basic frequency in this case is preferably the desired frequency that is to be provided by the active system inverter.

Low-frequency system harmonics can be reduced by a suitable control of the inverter, if not entirely regulated out. This is different for effects resulting from the switching mode of the switching elements. The spectral components caused by this must as a rule be reduced by suitable switching means, and here in particular by passive filter circuits, to the extent that the requirements at a connection point of the electrical device at the power supply system can be complied with and other electrical devices or electrical devices, which are likewise connected to the power supply system, are not disrupted where possible. The reader is referred to the requirements mentioned at the start, in particular with regard to standardization, for further information.

A passive filter circuit is typically formed from at least one capacitor and at least one choke, which are connected to one another in a suitable way. As a rule the at least one choke is connected in such a way that, during normal specified operation, an operating current of the electrical device flows through it. On the other hand the at least one capacitor is connected as a rule in such a way that, during normal specified operation, the operating voltage is applied to it.

Different switching topologies or switching structures are employed for passive filter circuits. As a rule what they have in common is a transverse filter branch with the at least one capacitor, which acts as a sort of lowpass filter or a bandpass filter and preferably keeps high-frequency interference components away from the power supply system. The at least one capacitor thus in particular forms an especially small impedance for high-frequency interference components, as are caused for example by the switching operation of the switching elements, so that these—figuratively speaking—will be short circuited by the transverse filter branch with the capacitor. A filter effect of the filter circuit thus depends inter alia on a capacitance value of the capacitor in the transverse filter branch.

The capacitance value of the at least one capacitor can change over time, as a result of aging manifestations for example, in particular when the capacitor is formed by one or more electrolytic capacitors, as a result of high and/or low temperatures at least at times during normal specified operation, as a result of being stressed with an overvoltage from the power supply system, as a result of an overload from adjacent connected electrical devices, which can cause an interference power that is too high, in particular impermissible in an operating range of the filter circuit, and can thus cause large electrical currents in the at least one capacitor, as a result of mechanical damage in the area of the filter circuit and also as a result of deliberate temporary separation of the transverse filter branch from the power supply system, for example in order to protect the capacitor during normal specified operating situations. This can in particular be provided for filter circuits with an LCL circuit structure with low passive attenuation, which for operation which adheres to standards and is inherently safe, can additionally require an active attenuation, for example with the aid of regulated switching actions of the inverter. If this type of regulation of the inverter is not active, it can be necessary to guarantee protection against for example an impermissible resonance of the filter circuit in another way, for example by means of a contactor disconnector and/or the like.

In order to be able to determine the function of the at least one capacitor of the filter circuit, there has previously been provision in the prior art, in addition to detecting the capacitor voltage, at the same time also to detect an electrical current through the at least one capacitor. Using calculation methods of complex alternating current calculation the capacitance value can then be calculated, and this can be done using the following formula:

$$C_F = \frac{|I_F|}{2\pi f_{system}|U_F|}$$

If the power supply system involves a three-phase alternating current network, the above formula applies to each phase of the alternating current network.

In many cases filter circuits and also electrical devices, in particular inverters, are separate devices, so that the current measurement required for this on the inverter side represents an external measurement. This involves a high material, manufacturing and cost outlay. Since the aforementioned current measurement, unlike measurement of the electrical voltage on the at least one capacitor, is generally not needed for other control and/or regulation purposes or supervision purposes, an unfavorable cost-benefit ratio arises. This type of supervision of the at least one capacitor of the filter circuit is thus merely offered as a costly additional option in the prior art. Therefore there is also frequently no use made in the prior art of this type of supervision function, so that the risk of a defect with regard to the at least one capacitor with the corresponding consequential damage must be taken into consideration.

Above and beyond this it has to be noted that for the specific case of a supervision of a contactor disconnector arranged as an enhancement in the transverse filter branch, as a rule protection with a feedback is needed. This means that costs for the disconnection switch are high. Furthermore this leads to a high outlay with regard to the manufacturing and the wiring.

A supervision of filter capacitors is disclosed, for example, in EP 3 232 217 A1. In accordance with this teaching filter capacitors are charged with a short pulse and an oscillation arising here in respect of voltage or current is measured. To this end one connection of the filter circuit is disconnected from the power supply system. Through evaluation of the oscillation a conclusion can be drawn about a state of the filter capacitors. This teaching is only able to be used outside of the normal operation of the electrical device, however.

U.S. Pat. No. 9,819,255 B2 further discloses an option for actively attenuating resonances in filter circuits. To this end a system impedance is determined in that pulse frequencies are changed. As a result of the reaction of the filter circuit, for example by resonances of the filter circuit being determined, the system impedance can be calculated and a regulator circuit as well as other parameters for the regulation can be set. If necessary different electrical resistances are activated one after the other for attenuation. There is no provision for a supervision of the state of the filter circuit, in particular of the at least one capacitor, in accordance with this teaching. In this method the pulse frequency must be varied. This can however cause increased or impermissible system perturbations and in particular also increased switching losses. This can thus lead, as well as to the increased or impermissible system perturbations, to an increased thermal stress on the inverter. It is further to be noted that an, in particular selective, switching-in of at least one damping resistor can mean an additional high outlay.

Overall it is desirable to determine the function of the at least one capacitor so that the requirements in respect of electromagnetic compatibility, in particular with regard to line-conducted interferences, can be permanently guaranteed. If moreover a disconnection switch is provided in the transverse filter branch, by means of which the at least one capacitor can be activated or deactivated, a supervision of the functionality of the disconnection switch can also be required at the same time. In this case the required outlay must be as small as possible.

The object of the invention is therefore to realize the determination of the function of the at least one capacitor of the filter circuit largely with available functionalities of the electrical device and thereby largely to avoid additional outlay where possible.

SUMMARY OF THE INVENTION

A method, a determination device and also an electrical device in accordance with the independent claims is proposed as a solution for the invention.

Advantageous developments are produced by features of the dependent claims.

As regards a generic method, it is proposed in particular that a connection voltage of the electrical device is detected, spectral components are determined in each case for the capacitor voltage and the connection voltage, and the function of the at least one capacitor is determined, in that the spectral components are evaluated by means of at least one statistical processing operation in consideration of the inductance value of the at least one choke.

As regards a generic determination device it is proposed in particular that the determination device is embodied to detect a connection voltage of the electrical device, to determine spectral components in each case for the capacitor voltage and the connection voltage and to determine the function of the at least one capacitor in that the determination device evaluates the spectral components by means of at least one statistical processing operation by taking into account the inductance value of the at least one choke.

As regards a generic electrical device, it is proposed in particular that this comprises a determination device in accordance with the invention.

The Invention is based on the knowledge that the filter effect of the passive filter circuit in a spectral range above a clock rate during normal specified operation of the electrical device is essentially dependent on the at least one capacitor of the passive filter circuit, and that this is true in a wide range almost independently of whether and which electrical devices are connected as enhancements to the power supply system. This allows the function of the capacitor to be determined with the aid of spectral components of the capacitor voltage and of the connection voltage and using the inductance value of the at least one choke as well as at least one statistical processing operation, at least with a predeterminable reliability. This means that—unlike in the prior art—an electrical current through the at least one capacitor of the passive filter circuit no longer needs to be detected. Unlike in the prior art, the invention thus does not need expensive and complex current sensors in order to be able to determine the function of the at least one capacitor of the filter circuit.

This enables the invention not only to be realized simply and at low cost, but it is therefore in particular also suitable for an upgrade to already existing electrical devices. In this way electrical devices for which a corresponding functionality has not been provided thus far for cost reasons can in particular be equipped retrospectively with this functionality in accordance with the invention. Overall the invention, at little expense, allows the reliability and the safety to be markedly improved during normal specified operation of the electrical device on the power supply system.

Even if the invention is directed in particular to passive filter circuits with an LCL circuit structure, it is not restricted to this however. The circuit structure of the passive filter circuit can naturally also be modified in almost any way to enable a desired filter functionality to be realized, wherein the application of the invention continues to be possible to a large extent.

The capacitor voltage and also the connection voltage can be detected by means of one or more suitable voltage sensor units. The voltage sensor units can be connected to the control unit and if necessary also be included in said unit. Above and beyond this voltage sensor units that are already provided in any case in the electrical device for normal specified operation thereof can naturally also be used. In this case no separate voltage sensor units thus need to be provided for voltage detection. Naturally combinations hereof can also be provided.

If the electrical device comprises a system inverter for example the connection voltage can be that voltage that the system inverter provides on the power supply system side. Preferably this involves the electrical voltage that is present on the device side at the filter circuit.

The capacitor voltage and the connection voltage are then handled in such a way that initially spectral components are determined in each case. The determination of the respective spectral components can be carried out by means of a suitable mathematical transformation or the like, for example a Fourier transformation, a Laplace transformation, derivates hereof and/or the like.

The spectral components determined hereby regarding the capacitor voltage and the connection voltage can then be evaluated in consideration of the inductance value of the at least one choke by means of at least one statistical processing operation. To this end there can be provision for the inductance of the at least one choke either to be predefined for the evaluation, by a measured inductance value of the choke being made available, or the inductance value of the choke is determined in another suitable way, for example in that suitable electrical variables are detected by means of sensors, from which the inductance value of the choke can be determined, or the like.

A frequency-dependent damping of the passive filter circuit can then be determined from the spectral components and the inductance value of the at least one choke, which allows an estimated value for a capacitance value of the at least one capacitor to be calculated. Then the function of the at least one capacitor can be derived from the estimated value. The function of the at least one capacitor determined hereby can then be made available for example to a filter supervision unit with a usage warning and/or fault shutdown. The usage warning can for example be an output that outputs a signal when the function of the at least one capacitor is no longer guaranteed for the normal specified operation of the passive filter circuit. Accordingly a fault shutdown can also be provided, which makes it possible to deactivate the electrical device when a corresponding signal is present.

The invention exploits the fact that, through the circuit structure of the passive filter circuit, the filter damping above a threshold frequency essentially depends on the impedance in the transverse filter branch and thus on the at least one capacitor. This property makes possible a sufficiently precise estimation of the capacitance value of the at least one capacitor without a corresponding current measurement having to be necessary. This is possible although further electrical devices of unknown type and if necessary also with widely varying system properties can be connected on the power supply system.

According to an advantageous development it is proposed that the at least one capacitor has an electrical reference potential applied to one of its connections and an electrical phase potential applied to another of its connections. This development is in particular geared to the power supply system being an alternating current system. If the power supply system is a multiphase alternating current system, a corresponding passive filter circuit can be provided for each phase of the multiphase alternating current system. Especially advantageously there can be provision for a three-phase alternating current system to be provided, wherein the at least one capacitor in each case of the respective filter circuits are electrically connected to one another with one of their connections and can thereby form the electrical reference potential. Through this embodiment the desired inventive function can also be realized in an especially simple manner with three-phase alternating current systems as power supply systems.

It is further proposed that the connection voltage and/or the capacitor voltage are detected discretized and the evaluation is carried out digitally. Discretized detection in this instance means that the respective of the voltages is preferably detected both value-discretely and also time-discretely. This opens up the option for supplying the corresponding respective voltages to the digital signal processor. Through this an improved realization of the invention can be achieved. In particular this embodiment also allows the invention to upgrade existing electrical devices in which digital signal processing is already present in a simple manner. The time-discrete detection of the respective voltage can provide for the electrical voltage to be detected to be sampled at predeterminable, preferably equidistant points in time. In this case a respective sampling rate is preferably at least twice as large as the largest frequency of the respective voltage to be sampled. The respective voltages discretized in this way can then be supplied to a digital signal processor, in that for example a digital transformation will be employed with regard to the determination of the respective spectral components.

Preferably the evaluation comprises a determination of a capacitance value of the at least one capacitor. This allows even gradual changes of the passive filter circuit over a period of operation, which are defined by the at least one capacitor, to be determined. This makes it possible to be able to supervise the passive filter circuit more precisely in respect of its normal specified function. This development is thus in particular also directed to the passive filter circuit being able to be subject to ageing during normal specified operation, which can lead to the desired filter effect reducing as the period of operation increases. The determination of the capacitance value of the at least one capacitor then allows a check to be carried out to determine whether the filter circuit is still providing an adequate filter effect during current normal specified operation.

If it is determined, for example, that the capacitance value is reduced so far that the filter circuit is not capable of still providing or now no longer capable of providing the normal specified filter effect, a maintenance signal can be triggered, for example. A deactivation signal can also be triggered, for example, by means of which the electrical device is then deactivated. Through maintenance, for example by replacing the at least one capacitor, the filter circuit can then be reset so as to function according to specification again, so that the operation of the electrical device can be resumed again.

This can be done for example by it being determined by means of the determination device that the maintained passive filter circuit is providing a sufficient capacitance value with regard to the at least one capacitor and is thus capable of providing the normal specified filter effect during normal specified operation. A corresponding activation signal for the electrical device can then be provided, so that even an automatic activation can be generated.

Above and beyond this it is proposed that evaluation comprises a comparison of the determined capacitance value with a capacitance comparison value. What is achieved by this is to enable the passive filter circuit, during normal specified operation, to be able to be almost continuously supervised or also at predeterminable points in time, wherein by comparing the determined capacitance value with the capacitance comparison value, it can be determined whether the capacitance value of the at least one capacitor that has been determined at that time is sufficient to be able to realize the specified function of the filter circuit.

It Is furthermore proposed that, for the evaluation, only a part of the spectral components above a limit frequency defined by the filter circuit is taken into consideration. This enables the effort required for the evaluation to be reduced, in particular based on the knowledge that the effects of the at least one capacitor with regard to the filter properties as a rule occur far above the limit frequency of the passive filter circuit. This takes into consideration the fact that the passive filter circuit as a rule provides a lowpass and/or a bandpass effect. The effects of changes with regard to the capacitance value of the at least one capacitor can therefore be especially well determined in an area above the limit frequency.

In accordance with a development it Is proposed that a switching state of switching element connected in series with at least one capacitor is determined. The at least one switching element can—as already mentioned at the outset—serve to activate or also to deactivate the at least one capacitor of the passive filter circuit and can do this as a function of a respective load state of the passive filter circuit. The switching element is frequently formed by an electromechanical switching element, for example by a disconnection switch in the form of a relay, a contactor, or the like. It can also be formed by an electronic switching element however, for example a transistor or the like, which is operated in a switching mode. The switching element can however also have a fault as regards normal specified operation, so that in particular when the at least one capacitor is to be activated, a defect of the switching element can lead to the at least one capacitor still not being activated. This can likewise be determined with the invention in the same way. It is thus not necessary to provide additional specific hardware, which would make possible a supervision of the switching function of the switching element. Instead the invention can likewise check the functionality of the switching element at the same time.

It proves especially advantageous for the method to be applied in an electrical device that comprises an inverter. Since as a rule the inverter already comprises an at least partially digital controller, the invention can also be retrofitted in a simple manner or implemented as an enhancement with such an electrical device. The use of the invention proves to be especially advantageous for active system inverters.

The Invention can furthermore be applied especially advantageously to a filter circuit that comprises an LCL circuit structure. The invention is however not limited to this type of circuit structure.

It is furthermore proposed that the evaluation comprises an anti-aliasing filtering. What can be achieved by the anti-aliasing filtering is that in particular with at least part digital signal processing or at least part digital evaluation, interferences for example as a result of carrying out transformations can be reduced, if not entirely avoided. With regard to aliasing the reader is referred for example to literature such as Steinbuch, Rupprecht, Nachrichtentechnik [Telecommunications engineering], 3rd Edition, Volume 2, Springer-Verlag 1982 or the like.

The advantages and effects specified for the inventive method naturally also apply in equal measure to the inventive determination device and also to the inventive electrical device and vice versa. As a result apparatus features can naturally also be formulated for method features and vice versa.

BRIEF DESCRIPTION OF THE DRAWING

Further advantages and features are given by the exemplary embodiments below, which refer to the enclosed figures. In the figures the same reference characters refer to the same features and functions.

In the figures.

DETAILED DESCRIPTION OF PREFERRED EMBODIMENTS

Figure 1:
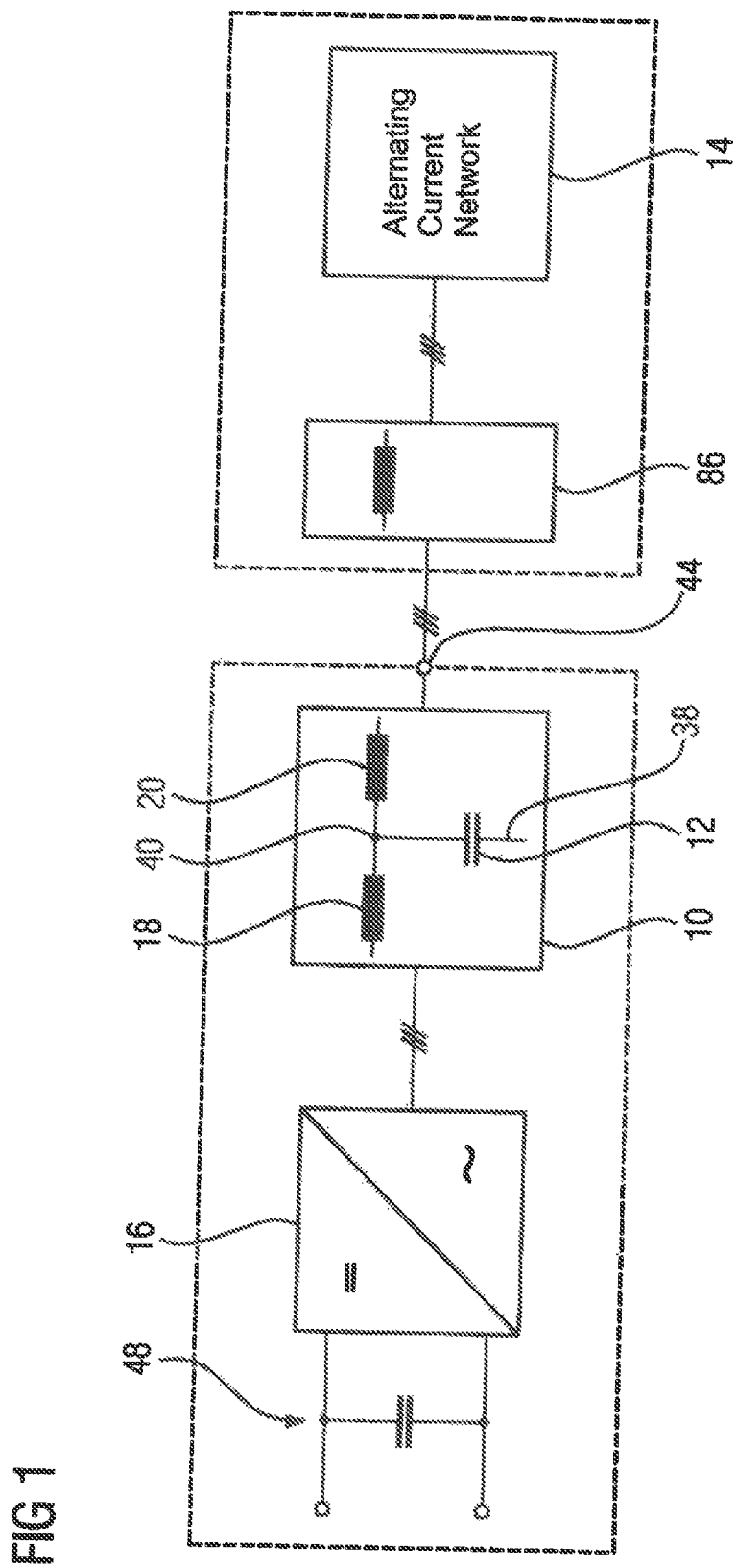
FIG. 1: shows a schematic block diagram of a system inverter connected via a passive filter circuit to a three-phase alternating current system.

FIG. 1 shows, in a block diagram, an electrical device, which in this figure has an active system inverter 16, which is electrically coupled via an LCL filter 10 as passive filter circuit to a three-phase alternating current system 14 as the power supply system. The system inverter 16 serves to electrically couple the alternating current network 14 to a dc link circuit 48.

The system inverter 16 is embodied for a bidirectional power coupling between the dc link circuit 48 and the alternating current system 14. To this end the system inverter 16 comprises half bridge circuits with switching elements, not shown in any greater detail, which are formed in this figure by transistors, which are operated in a suitable way in a switching mode by a control unit likewise not shown.

On the ac voltage side the system inverter 16 is coupled electrically via the LCL filter 10 to the alternating current system 14. For each phase of the three-phase ac voltage of the alternating current system 14 a respective branch of the LCL filter 10 is provided, which in each case comprises two chokes 18, 20 connected in series and also in a transverse filter branch a capacitor 12. The capacitor 12 is coupled electrically by one of its connections to an electrical reference potential 38, which is the same for all phases, and by a second connection to a corresponding phase potential 40, which is individual for each phase of the alternating current system 14. The system inverter 16 is coupled electrically, together with the LCL filter 10, to the power supply system 14 via an electrical connection 44.

The LCL filter 10 is embodied to at least partially reduce line-conducted interferences, to which end the LCL filter 10 comprises the capacitor 12 having a predefined capacitance value and in this embodiment two chokes 18, 20 with predefined inductance values in each case.

In FIG. 1, with regard to the alternating current system 14, a system inductance 86 is shown as a separate element for a respective phase of the alternating current system 14. In reality it is essentially determined by line inductances of the alternating current system 14.

The switching elements of the system inverter 16 in the present example are operated in switching mode with a clock rate in a range of around 4 kHz. The clock rate can however also be selected between a few 100 Hz to a few 100 kHz, preferably between around 2 kHz to around 20 kHz. It does not need to be constant.

So that at connection 44 requirements in respect of electromagnetic compatibility, in particular with regard to line-conducted interference, can be compiled with, the LCL filter 10 is provided. What can be achieved through suitable dimensioning of the chokes 18, 20 and the capacitor 12 is that the predefined requirements at connection 44 can be compiled with.

Figure 2:
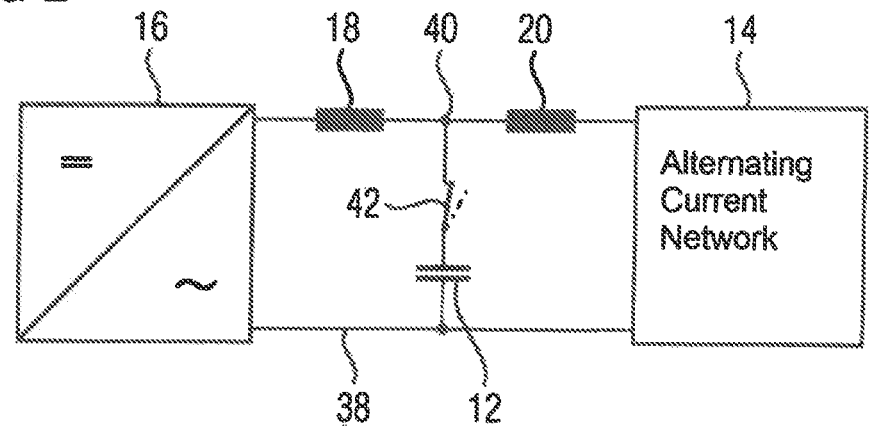
FIG. 2: shows a schematic switching diagram for a first embodiment of a passive filter circuit in the form of an LCL filter.
Figure 3:
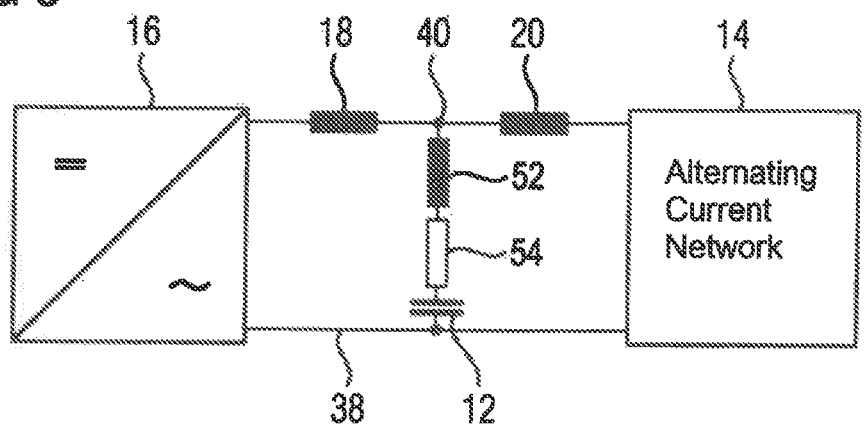
FIG. 3: shows a schematic switching diagram for a second embodiment of a passive filter circuit in the form of a choked LCL filter with damping.
Figure 4:
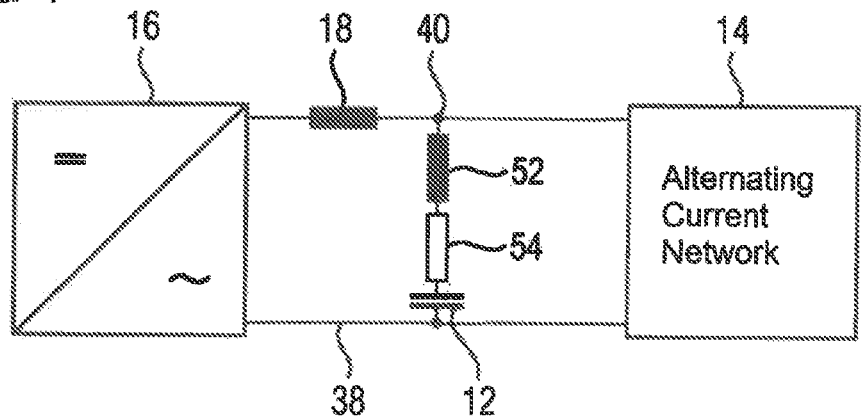
FIG. 4: shows a schematic switching diagram for a third embodiment of a passive filter circuit in the form of an LC filter with damping.

FIG. 2 to 4 show different possible embodiments for the passive filter circuit, as can be used in the embodiment in accordance with FIG. 1. These circuit structures are not definitive however and merely show a few alternate exemplary embodiments, which can naturally also still be combined in any given way in respect of the circuit structure.

FIG. 2 shows a typical LCL filter 10 with the two chokes 18, 20 and the capacitor 12, wherein in this example a contactor 42 is also connected in series with the capacitor 12, by means of which the capacitor 12 is able to be activated or deactivated as a function of a respective switching state of the contactor 42.

FIG. 3 shows an alternate embodiment for the circuit structure in accordance with FIG. 2, which is based on the circuit structure in accordance with FIG. 2, however. Unlike the embodiment in accordance with FIG. 2, in the embodiment in accordance with FIG. 3, instead of the contactor 42 in FIG. 2, a series circuit consisting of a further choke 52 and an electrical resistor 54 is now provided. What is involved here is a choked LCL filter with damping.

FIG. 4 shows a variation of the embodiment in accordance with FIG. 3 in which, instead of the choke 20, a short circuit: is provided. Through this an LC filter with damping is formed. The aforementioned filter circuits can naturally also be combined with one another in order to arrive at further passive filter circuits within the framework of the invention. Naturally there can also be provision for a respective passive filter circuit to comprise more than just one single capacitor 12. A number of capacitors 12 can also be provided, which at least partially can also be connected in parallel.

Figure 5:
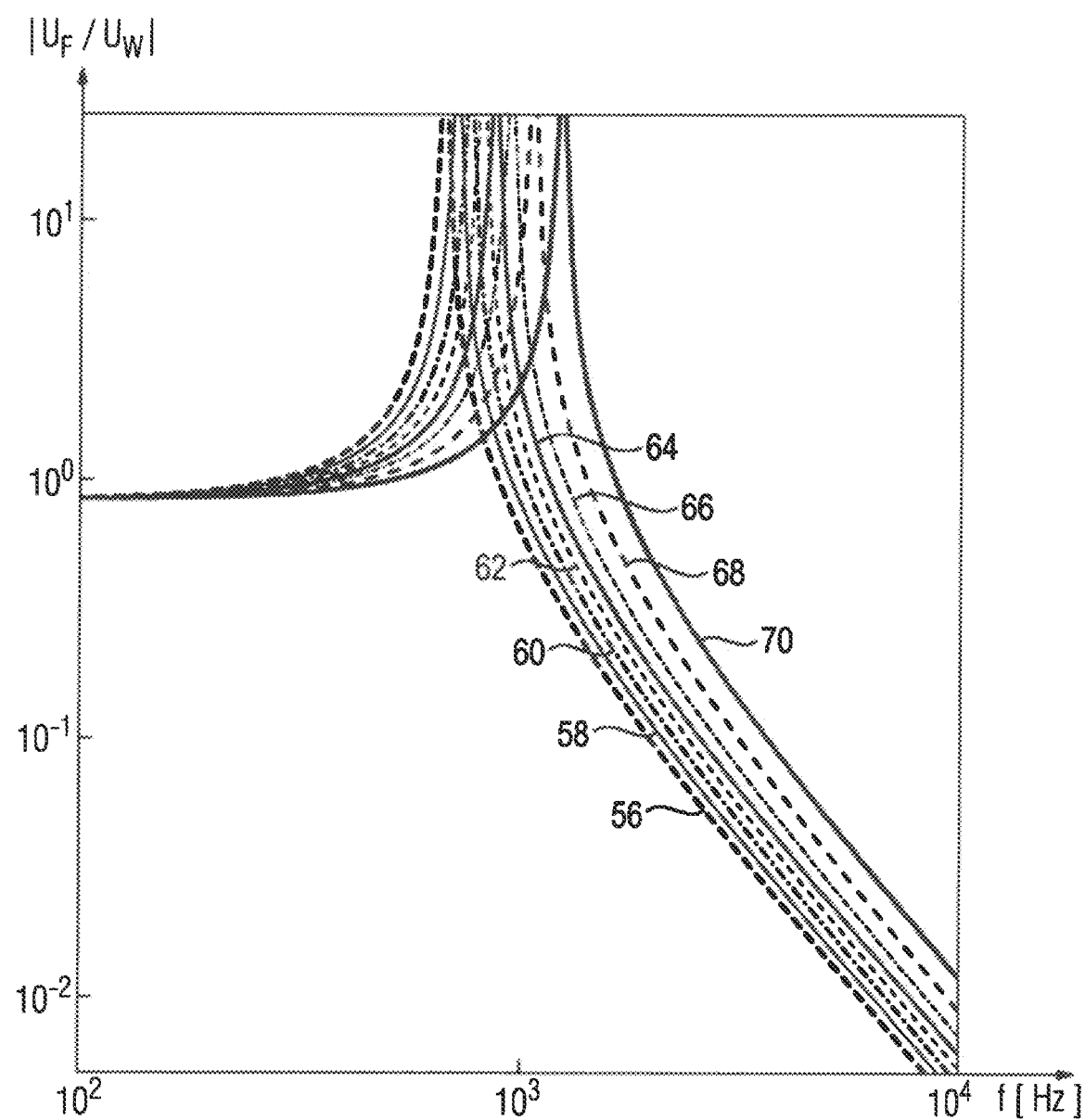
FIG. 5: shows a schematic diagram to show filter damping for the passive filter circuit in accordance with FIG. 2.

FIG. 5 shows a schematic diagram to illustrate the filter damping of the LCL filter 10 in accordance with FIG. 1 or 2, when the contactor 42 is in the switched-on switching state. The abscissa of the diagram in accordance with FIG. 5 is assigned to a frequency in Hertz. An ordinate of the diagram in accordance with FIG. 5 is assigned to a ratio of spectral components 26, 28. These are determined accordingly, as will be explained below, from electrical voltages detected by means of a voltage sensor unit 36, and indeed from an output voltage 22 of the system inverter 16 as well as a capacitor voltage 24 of the capacitor 12. For the purposes of this diagram it is assumed that a very small damping resistance in the range of 1 mΩ is present A system-side inductance value amounts to around 30 μH. An inductance value of the chokes 18, 20 amounts here to around 300 μH. The filter effects at different capacitance values for the capacitor 12 are shown by means of the graphs 56 to 70. The graph 56 in this case can be assigned to a capacitance value of 1 mF. The graph 58 is assigned to a capacitance value of 900 μF. The graph 60 is assigned to a capacitance value of 800 μF. The graph 62 is assigned to a capacitance value of 700 μF. The graph 64 is assigned to a capacitance value of 600 μF, the graph 66 is assigned to a capacitance value of 500 μF, the graph 68 is assigned to a capacitance value of 400 μF and the graph 70 is assigned a capacitance value of 300 μF.

The LCL filter 10 in this case is typically dimensioned in such a way that spectral components resulting from the clocked operation of the system inverter 16 above a filter resonant frequency in a range of the clock rate of in the present case for example around 5 kHz are reduced, so that at connection 44 essentially only standard-compliant small spectral components are able to be detected. As can be seen from FIG. 5, a halving of the capacitance value of the capacitor 12 would lead to a doubling of the network perturbations and can thus result in a disruption of or damage to neighboring electrical devices.

The Invention accordingly makes it possible to permanently guarantee a capacitance value of the capacitor 12 and thus compliance with the requirements for network perturbation. With supplementary arrangement of the contactor 42 in series with the capacitor 12 in particular it can in addition be achieved at the same time that a closing function of the contactor 42 is also supervised.

Figure 6:
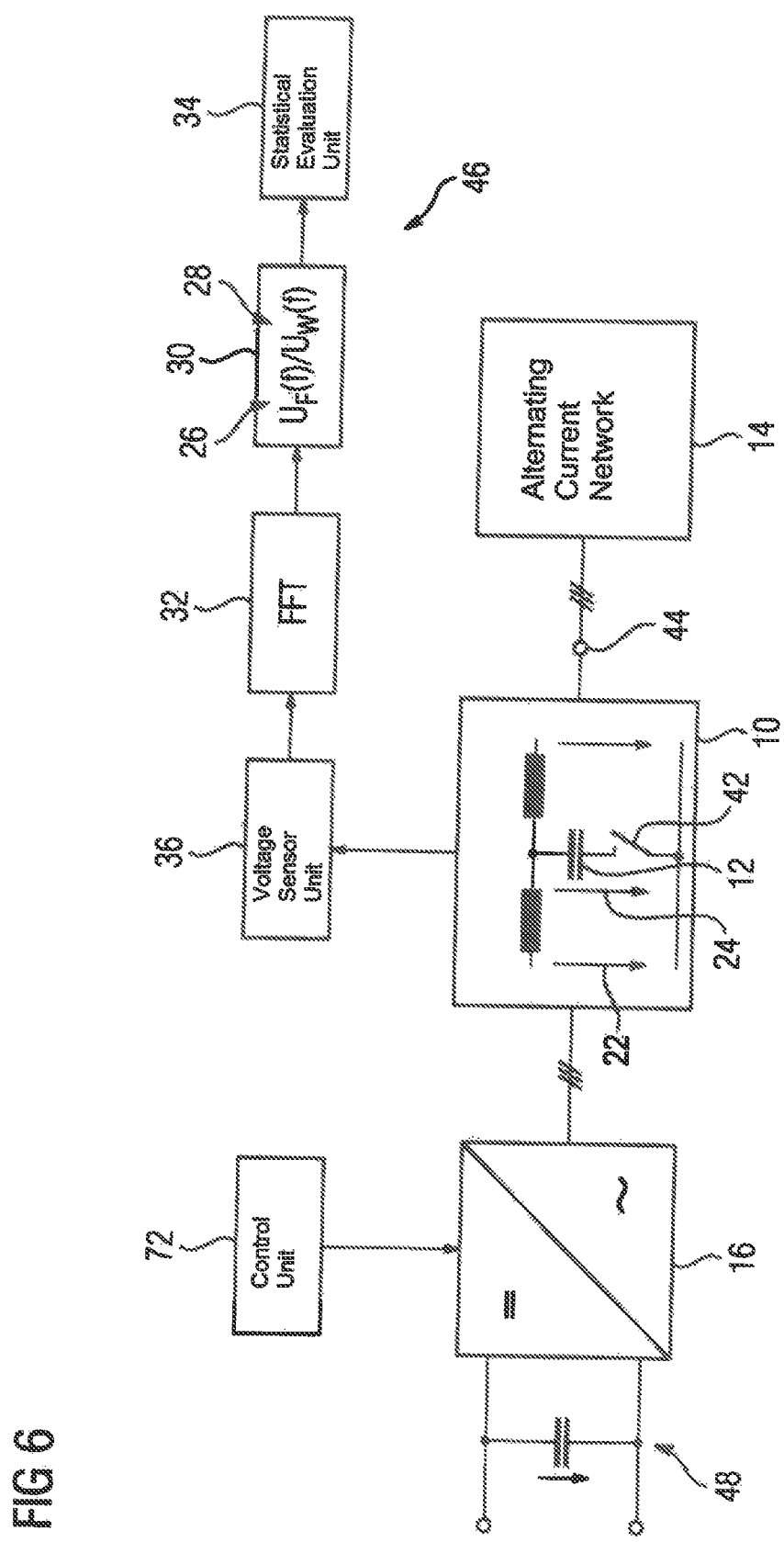
FIG. 6: shows a schematic block diagram like FIG. 1, but with a determination device in accordance with the invention.

FIG. 6 now shows, based on FIG. 1, an enhancement within the framework of the invention, by means of which a supervision of the capacitor 12 of the LCL filter 10 can be achieved, without current measurement having to be used in addition. To this end, as can be seen from FIG. 6, along with a connection voltage 22, which is provided directly by the system inverter 16 on the ac voltage side, a capacitor voltage 24 is also detected at the capacitor 12. This is done by means of the voltage sensor unit 36, which detects these voltages digitized in each case. Even if digital signal processing is provided in the present example, the function of the invention can naturally fundamentally also be realized at least by analog means.

It can be seen from FIG. 6 that the system inverter 16 comprises a control unit 72, by means of which the switching elements of the system inverter 16 not shown can be operated in a suitable way in switching mode, so that the desired power conversion function can be realized.

For the purposes of discretized detection of the voltages 22, 24 a sampling rate is selected to be high enough for frequency components, in particular with regard to the clock rate of the system inverter 16 still to be able to be reliably detected. As a rule the sampling rate of the voltage sensor unit 36 is therefore at least twice as high as the highest clock rate of the system inverter 16. Taking into consideration the sampling theorem, a reliable detection also of spectral components can then be guaranteed as a result of the clocking of the system inverter 16.

By means of a Fourier transformation unit 32, which in the present example is a digital Fourier transformation unit, in particular an FFT, the spectral components 26, 28 can be determined with regard to the detected voltages 22, 24. Even if in the present example a Fourier transformation is provided, another suitable transformation can be used here, for example a Laplace transformation or the like.

At least the connection voltage 22 is sampled with a sampling rate high enough for spectral components resulting from the clocked operation of the system inverter 16 to be able to be detected reliably and to be able to be processed by the Fourier transformation unit 32.

In an alternate embodiment there can be provision for the connection voltage 22 also to be able to be computed with sufficient precision from a voltage value of the dc link circuit voltage on the dc link circuit 48 that is typically present, and as a rule varies relatively slowly, and from a knowledge of a signal timing sequence. A voltage sensor for detecting the connection voltage 22 can then be saved.

In order to be able to determine the function of the capacitor 12, at least one inductance value of the choke 18 is also needed. This involves a known value, which can either be predefined externally or can also be detected by means of a suitable measurement facility for example. This can be done for example by an external measurement device or preferably also in a preceding measurement step by means of the system inverter 16 itself.

By means of a processing unit 30 the spectral components 26, 28 and also the inductance value of the choke 18 are processed, in order to compute a frequency-dependent filter damping or an estimated value for a capacitance value of the capacitor 12. A corresponding method result can be made available to further filter supervision with a usage warning and/or an error deactivation for the system inverter 16. To this end, as a supplement to the processing unit 30 a statistical evaluation unit 34 is provided, which determines the corresponding estimated value. For this the statistical evaluation unit 34 can use suitable statistical evaluation methods, in particular from the area of estimation theory. In particular the possibility exists of comparing the estimated capacitance value of the capacitor 12 with a capacitance comparison value, in order to be able to provide a corresponding control signal for the filter supervision or the like.

As regards the function, the fact is in particular exploited that through the chosen LCL circuit structure the damping of the filter circuit above a limit frequency depends almost exclusively on an impedance in the transverse filter branch and thus on the capacitor 12. Through this property it is made possible for a sufficiently precise estimation of the capacitance value to be able to be achieved without the requirement for a current measurement. This object is achieved despite unknown and possibly greatly differing properties of the power supply system 14 and also of any further electrical devices that are connected to the power supply system 14.

In accordance with a further embodiment of the invention the method described above can also be used to determine a switching state of the contactor 42. Since in this case only a yes/no decision needs to be made, the invention can be used reliably in this regard even with serious interferences, in particular very disrupted measured values, large parameter errors for component values, for example with regard to the chokes 18, 20, with regard to other filter topologies and/or for serious interferences from the alternating current system 14, for example as a result of resonance points or active interference voltage sources or the like.

Figure 7:
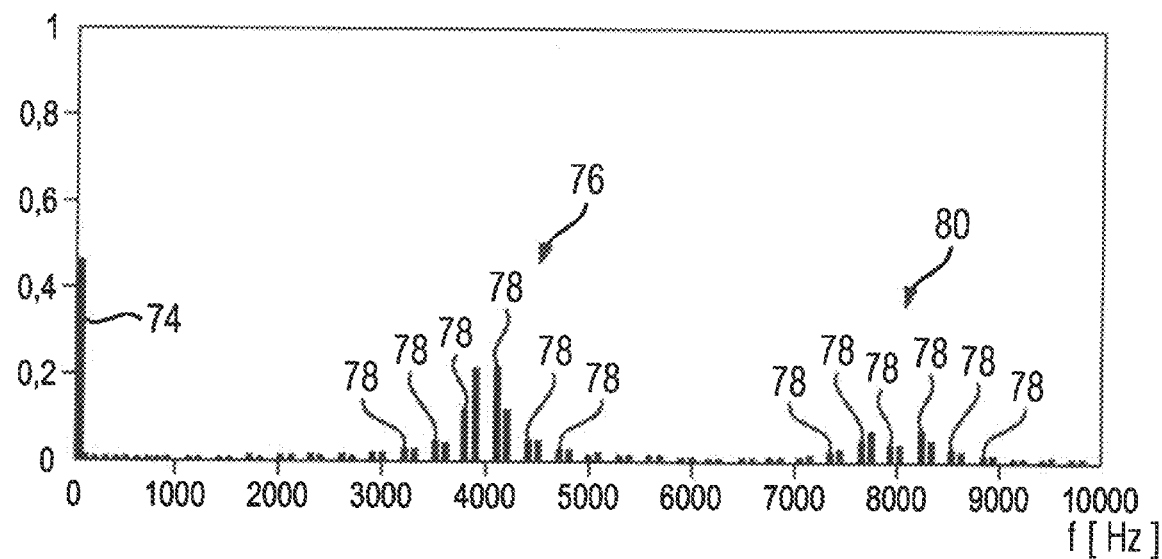
FIG. 7: shows a schematic diagram of a spectral analysis of a connection voltage of the inverter in accordance with FIG. 1 without a passive filter circuit.

FIG. 7 shows an example, in a schematic diagram, of a spectrum of the connection voltage 22 of the system inverter 16 without the LCL filter 10. An abscissa of the diagram is assigned to the frequency in Hertz, while an ordinate is assigned to a relative interference voltage.

It can be seen that in an entire left-hand area of the diagram a frequency of the ac voltage of the alternating current system 14, as is provided by the system inverter 16 and which in the present example lies at around 50 Hz, is shown as a basic oscillation by means of a graph 74. Above and beyond this it can be seen that in an area 76 around a frequency of about 4 kHz a number of amplitudes of spectral components, which are caused by the clocked operation of the system inverter 16 are shown by means of graph 78. The clock rate amounts on average to around 4 kHz with a modulation type PWM. As the distance from this clock frequency of around 4 kHz increases and also decreases, the amplitudes of graph 78 essentially decrease. In a range 80 greater amplitude values of the graph 78 are once again to be observed, and indeed at a frequency of around 8 kHz, which corresponds to around twice the clock rate of the system inverter 16.

It should be noted that a change in the clock rate of the system inverter 16 in the first approximation merely leads to a corresponding shifting of the spectral components, wherein the amplitude values of the respective spectral components and also the basic oscillation essentially remain unchanged. This also explains why, when an LCL filter 10 with a damping characteristic in accordance with FIG. 5 is used, damping rates become greater as the clock rate increases, in particular above a resonant frequency of the LCL filter 10, as has already been explained with the aid of FIG. 5. At connection 44 this enables an emission of interference in the direction of the alternating current system 14 to be reduced.

It can further be seen from FIG. 5 that a dependency of the damping of the capacitance value of capacitor 12 is especially produced when the frequency of the voltage that is applied to the LCL filter 10 is much greater than zero Hz. Such an application can be achieved by means of a suitable test signal. Fundamentally any connection voltage 22 with a signal component with a sufficiently large frequency would thus be possible as a test signal. A separate test signal does not need to be provided however, since this itself could lead to an additional emission of interference into the alternating current system 14 and could possibly also bring about additional losses in the system inverter 16 and also in the LCL filter 10. Instead the connection voltage 22 of the system inverter 16 is used exclusively as the test signal, as is shown with the aid of FIG. 7. Thus no separate additional test signal is required.

By rapidly switching between two or more different voltage levels the system inverter 16, averaged over time, can create an almost continuous voltage curve. The rapid switch between the voltage levels is preferably undertaken by using a PWM modulation. Fundamentally however other modulation methods are correspondingly able to be used. A frequency wobbling can also be used as well, i.e. an ongoing variation of the clock rate of the system inverter 16.

It should be noted that the capacitor voltage 24 as well as if necessary also the connection voltage 22 are detected correspondingly resolved over time, so that spectral components of the connection voltage 22 can be determined, wherein the frequencies of these voltage components lie high enough for the capacitor voltage 24 and also the voltage at connection 44 to be able to be determined definitively by the capacitance value of the capacitor 12. The sampling theorem according to Shannon should be noted here. A sampling rate regarding the voltage detection should therefore be at least twice as great as the highest frequency up to which a spectral resolution with regard to the detected voltages is to be able to be achieved. If for example a frequency range up to around 10 kHz Is to be detected, then a sampling period of less than 50 μs should be selected for the detection of the voltages.

Moreover it should be noted that multiples of the clock rate can likewise occur for the spectral components 26, 28 and thus a violation of the sampling theorem can be present if the sampling rate is not very high. Mirror frequencies can then occur with regard to the measured values that can falsify the measurement results. Therefore, before a sampling, an anti-aliasing filter, not shown in this example, should additionally be provided for band limiting of the signal to be digitized. A preferred version is an integrating measurement with what is known as a Sigma-Delta converter over one clock period of the PWM modulation.

Measurement values with regard to the capacitor voltage 24, in the case of a three-phase alternating current system 14, are the individual phase voltages 40, and these are in relation to the reference potential 38. In this case there can be provision for at least two phases to be detected and for the capacitor voltage 24 for a third phase to be computed from a zero-sum condition, or for at least two voltages between the phases to be detected and for the third corresponding voltage to be computed from a zero-sum condition. With a four-conductor system with a neutral conductor connection one value more is to be measured accordingly in each case, while with a two-conductor system on the other hand one conductor less is to be measured.

With regard to FIG. 2 to 4 it should further be noted that the different filter structures differ in their component costs and frequency responses and accordingly can be selected depending on the inverter type, a clock rate, or a modulation method. A passive damping by means of the electrical resistor 54 can reduce an increase in resonance, as will be further explained below. A choking by means of the choke 52 can provide new dynamic properties and for example create a minimum in the frequency response, whereby a reduced damping above a corresponding design frequency or limit frequency can be achieved. With the circuit structure in accordance with FIG. 4 it is further assumed that the system-side choke 20 can be omitted, because the power supply system 14 provides a suitable minimum inductance.

Overall it should be stated that the filter effect or the filter damping of the filter circuit in a suitably chosen frequency range primarily depends on the capacitance value of the capacitor 12 and the inductance value of the choke 18. The frequency range in this case is preferably selected in such a way that as unique a dependency as possible is produced and the connection voltage 22 contains a sufficiently large voltage component in this frequency range. Preferably the proposed method is applied to LCL filters with a small or without any damping resistor 54.

Basically the invention is naturally not just restricted to an application in a filter circuit between a system inverter and a power supply system but can equally well also be applied between a machine inverter and an electrical machine connected to said inverter. In this case the electrical machine is to be treated like the power supply system 14. The aim here can then be to protect the electrical machine, which could be damaged by a reduction in the capacitance value of the capacitor 12, so that greater damage could occur.

Examples are shown below of how the invention can be realized and properties as well as a measurement precision that can be achieved are estimated using examples.

Figure 8:
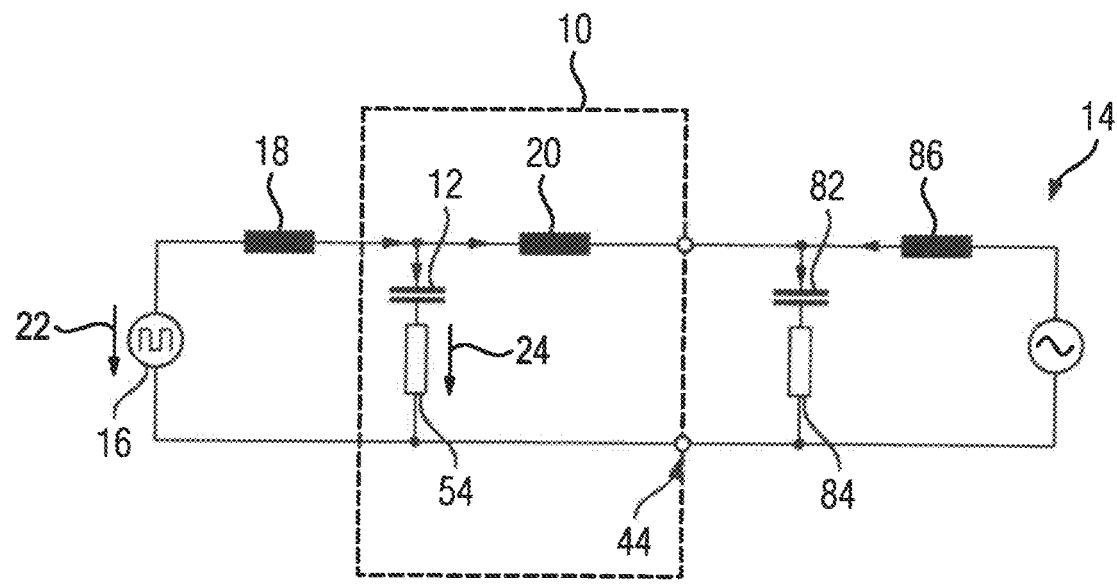
FIG. 8: shows a schematic equivalent switching diagram of a system comprising the inverter in accordance with FIG. 1, the LCL filter in accordance with FIG. 2 as well as schematically represented variables of the power supply system for one of three phases of the alternating current system.

To this end a schematic equivalent circuit diagram in accordance with FIG. 8 is used as the starting point, which is based on the filter circuit in accordance with FIG. 2. The equivalent circuit diagram represents the system inverter 16 in simplified form. The dc link circuit 48 and also any electrical units connected to it are not shown in the figure for reasons of clarity.

The system inverter 16 provides the connection voltage 22, which is why the system inverter 16 in the equivalent circuit diagram in accordance with FIG. 8 is merely shown as a voltage source. The equivalent circuit diagram in accordance with FIG. 8 further only shows one individual phase of the three-phase alternating current system 14. The same considerations apply for the two other phases of the three-phase alternating current system 14.

The equivalent circuit diagram in accordance with FIG. 8 represents an approximation of the three-phase overall system, which in particular emulates the pulse-frequency switching actions in the realization of switching operation of the system inverter 16 between the voltage levels on the inverter side. With the aid of the choke 18, which represents a commutation coil, and the transverse filter branch with the capacitor 12 as well as a resistor 54, the switching frequency components resulting from switching operation in the connection voltage 22 can already be greatly reduced. The size of the filter damping is determined with the aid of the filter frequency response, as can be determined with the aid of the following formula:

$$|H_{UFW}(j\omega)| = \left| \frac{U_F(j\omega)}{U_W(j\omega)} \right|$$

$U_F$ in this case corresponds to the spectral component 26 that is assigned to the capacitor voltage 24, and $U_W$ in this case corresponds to the spectral component 28 that is assigned to the connection voltage 22.

The filter effect can be further improved with the choke 20 and a defined minimum inductance value reached between the connection 44 and the capacitor 12.

Located on the system side are typically adjacent components, which can feature capacitive input filters for example, for example an EMC filter with a capacitor 82 and also a resistor 84 as well as further inductive components or transmission elements to a remote voltage source 88 of the power supply system 14, which in the equivalent circuit diagram are expressed as integral with the choke 86.

For a Laplace transfer function H for spectral analysis with a complex variable s the following relationship is found for example:

$$H_{UFW}(s) = \frac{U_F(s)}{U_W(s)} =$$

$$\frac{s^4 L_2 L_N C_F C_E R_F + s^2(L_S L_N C_E + C_F C_R R_F R_E L_{2N}) +}{s^2 L_{2N}(C_F R_F + C_E R_E) + s L_{2N}}{(s^5 a_5 + s^4 a_4 + s^2 a_2 + s^2 a_2 + s^1 a_1 + a_n)}$$

with
$L_{xN}=L_2+L_N$;
$a_2=L_1L_2L_NC_FC_E$;
$a_2=L_2L_NC_FC_ER_F+L_2C_FC_ER_EL_{2N}+L_1L_NC_FC_ER_F$;
$a_2=L_1L_NC_E+L_1C_FC_ER_FR_E+L_2L_NC_E+L_{2N}C_FC_ER_FR_E+L_1L_{2N}C_F$;
$a_2=L_1C_ER_E+L_1C_FR_F+L_{2N}C_FR_F+L_{2N}C_ER_E$;
$a_1=L_1+L_2+L_N$;
$a_0=0$;

$C_F$ is assigned to the capacitor 12, $R_F$ is assigned to the resistor 54, $L_1$ is assigned to the choke 18, $L_2$ is assigned to the choke 20, $L_N$ is assigned to the choke 86, $R_E$ is assigned to the resistor 84 and $C_E$ is assigned to the capacitor 82. Without the system-side branch with the capacitor 82 and the resistor 84, which would bring about an additional resonance point, the transfer behavior is simplified to $$H_{UFW1}(s) =$$

$$H_{UFW}[(s) | \square]_{CE=a,RE\rightarrow\infty} = \frac{sC_PR_F - F + 1}{s^2 L_1 C_F + sC_F R_F\left(\frac{L_1}{L_{2N}}+1\right)+\left(\frac{L_1}{L_{2N}}+1\right)}$$

To be noted for the determination of the functionality proposed here to be able to function are now the particular dependencies in the typical working and value ranges of the system parameters.

This will be further explained below with the aid of FIG. 9 to 13. In these figures the abscissa is assigned to the frequency in Hertz in each case and the ordinate is assigned to a relative ratio of the spectral components 26, 28.

Figure 9:
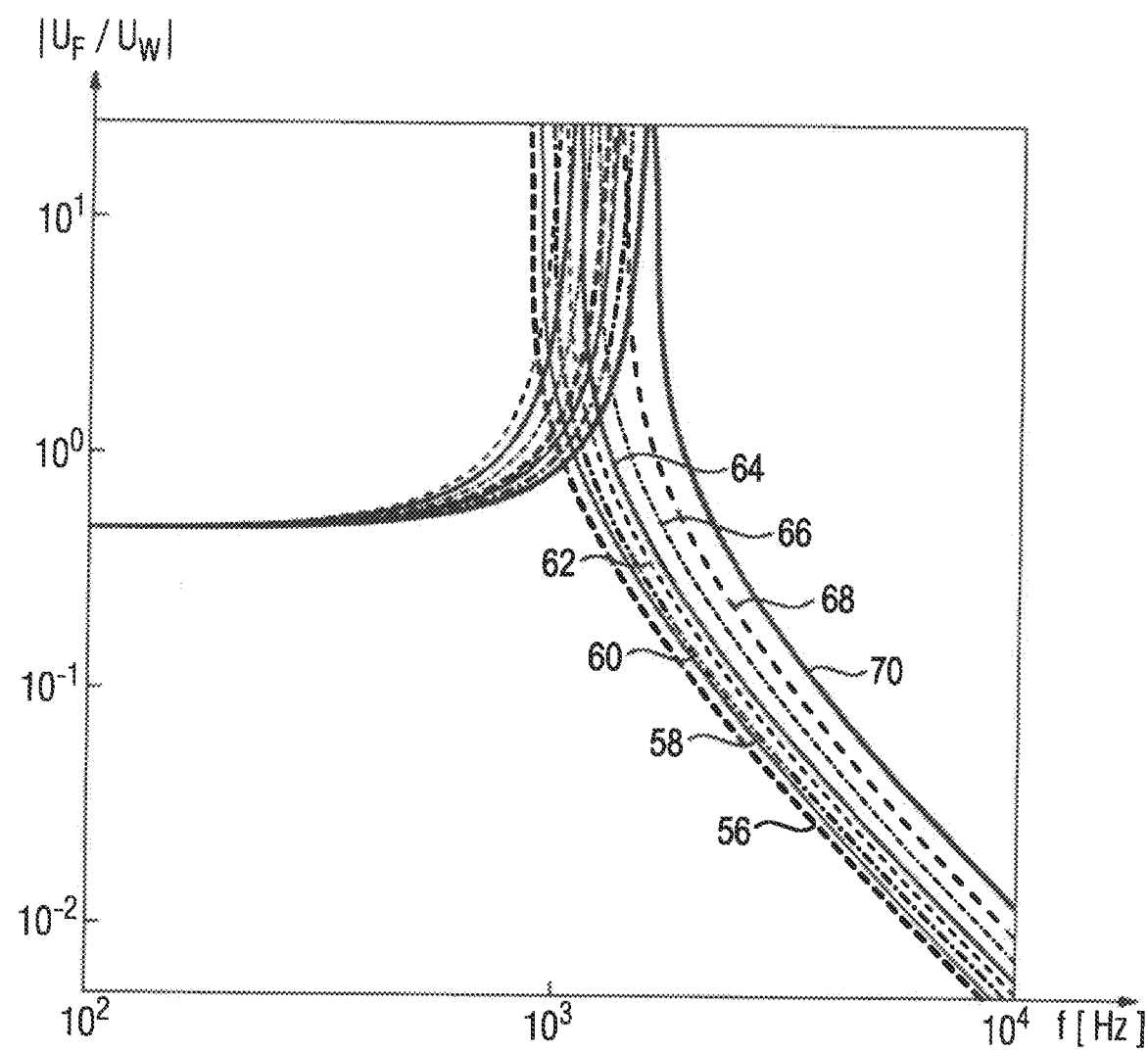
FIG. 9-13: show schematic diagrams like FIG. 5 for different layouts or operating states of the LCL filter in accordance with FIG. 2.

Shown again in FIG. 9 by means of the graphs 56 to 70 are dampings dependent on capacitance values for the capacitor 12. Assigned to graphs 56 to 70 is again the same capacitance value as explained for FIG. 5. In this embodiment the choke 18 has an inductance value of 70 μH. The resistor 54 has a resistance value of 1 mΩ. The electrical resistor 84 is realized by an interruption, and a serial power supply system-side resistance amounts to Ω.

As can be seen from FIG. 9, with the aid of graphs 56 to 70 a strong dependency of the filter effect on the capacitance value of the capacitor 12 at higher frequencies can be recognized. This also applies in particular for a working range above a resonance point, which lies here at around 5 kHz.

Figure 10:
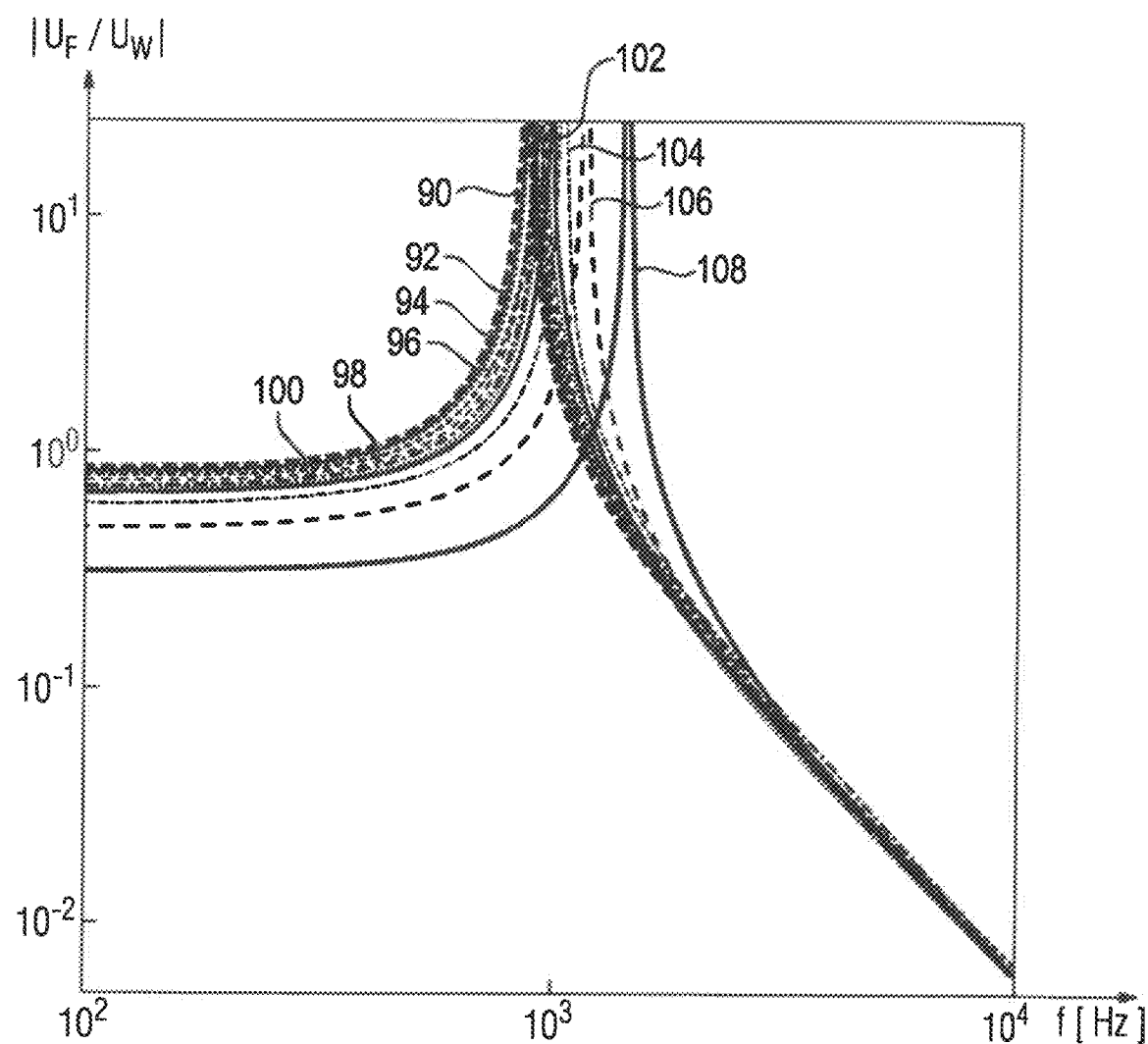

FIG. 10 shows a schematic diagram like FIG. 9, wherein here however the capacitance value of the capacitor 12 amounts to 600 μF. With the graphs 90 to 108 the damping values for different inductance values of the sums of the inductance values of the choke 20 with the choke 86 are shown. The graph 90 corresponds in this case to an inductance value of 300 μH, the graph 92 to an inductance value of 270 μH, the graph 94 to an inductance value of 240 μH, the graph 96 to an inductance value of 210 μH, the graph 98 to an inductance value of 180 μH, the graph 100 to an inductance value of 150 μH, the graph 102 to an inductance value of 120 μH, the graph 104 to an inductance value of 90 μH, the graph 106 to an inductance value of 60 μH and the graph 108 to an inductance value of 30 μH. The choke 18 here has an inductance value of 70 μH. The resistor 54 has a resistance value of 1 mΩ. The system-side impedance is assumed to be zero and the resistor 84 is realized by an interruption.

It can be seen from FIG. 10 that at higher frequencies almost no dependency on the system inductance, identified by the choke 86, exists, which can vary greatly precisely in the operation of the system inverter 16. The same applies as well for the ohmic component of a system impedance not shown. In this case it should be noted that the effective system inductance determines a short circuit power of the power supply system 14 at the connection 44 and can typically also be dependent on a rated power of the connection 44.

Figure 11:
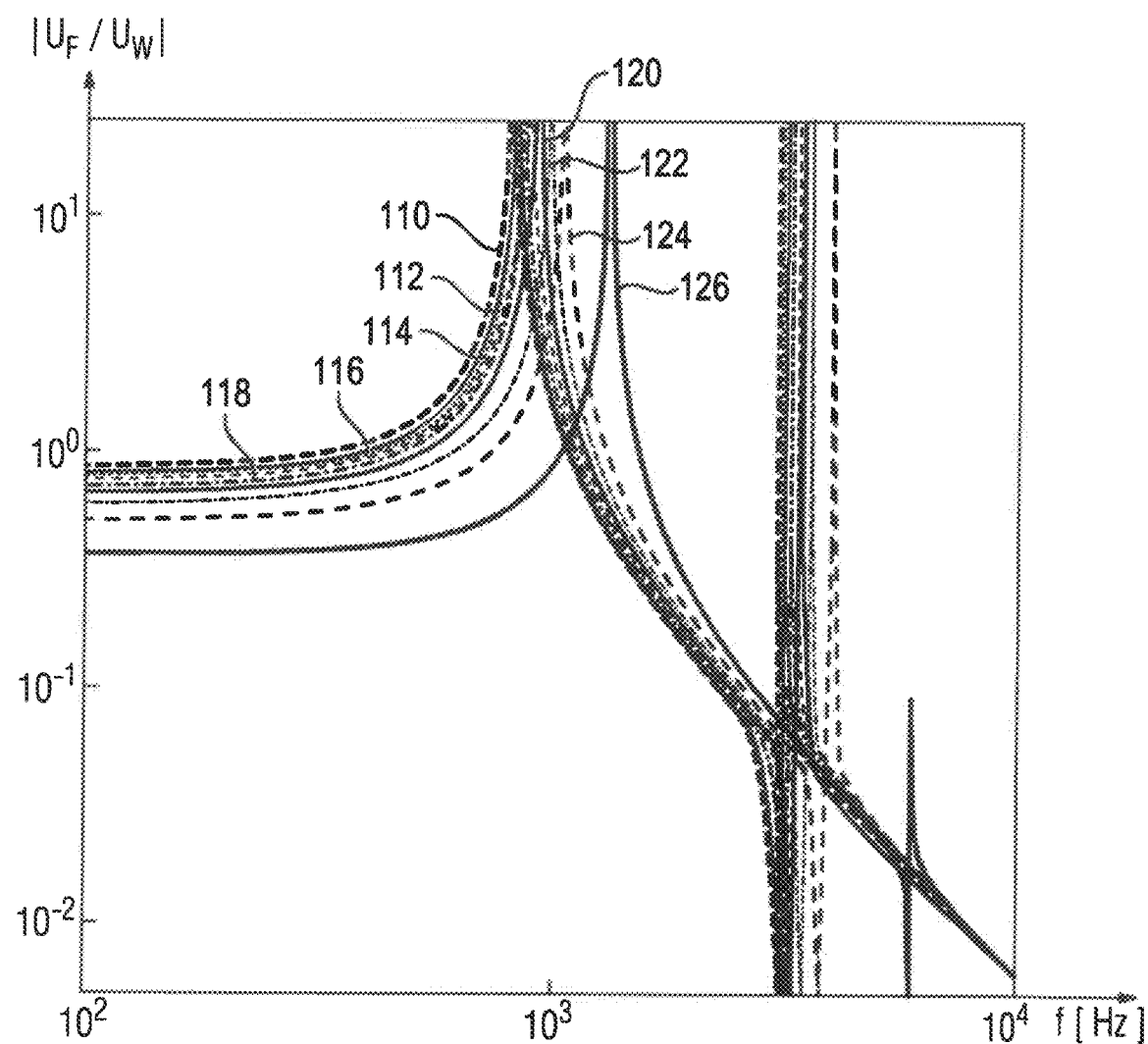

FIG. 11, in a schematic diagram like FIG. 10, shows that an undamped capacitance inserted in the vicinity of the system inverter 16, for example a capacitor of another filter, can introduce an additional resonance point in the range of the clock rate of the system inverter 16, which can greatly disrupt supervision of the own filter capacitance, namely of the capacitor 12. This is realized by the capacitor 82 and also by the resistor 84.

In FIG. 11 the choke 18 again has an inductance value of 70 μH, while the choke 20 has an inductance value of 30 μH. The capacitor 12 has a capacitance value of 600 μF, and the resistor 54 again has an electrical resistance value of 1 mΩ auf. The resistor 84 is formed by a short circuit. A capacitance value of the capacitor 82 amounts in this figure to 100 nF.

Dampings for different inductance values of the system inductance or the choke 86 are shown by means of graphs 110 to 126. The graph 110 is assigned to an inductance value of 290 μH. The graph 112 is assigned to a capacitance value of 255 μH. The graph 114 is assigned to an inductance value of 220 μH. The graph 116 is assigned to an inductance value of 185 μH. The graph 118 is assigned to a capacitance value of 150 μH. The graph 120 is assigned to a capacitance value of 115 μH. The graph 122 is assigned to an inductance value of 80 μH. The graph 124 is assigned to an inductance value of 45 μH and the graph 126 is assigned to an inductance value of 10 μH.

As can be seen from FIG. 11, an undamped capacitance of this type, as brought about in the present example by the capacitor 82, can prevent the determination of the function of the capacitor 12. As a rule an undamped capacitance of this type, as is provided by the capacitor 82, must however therefore already be avoided, because with it even regular operation of the system inverter 16 could cause strong disruptions in the system. Above and beyond this a device configuration of this type with undamped capacitors on the alternating current system 14 would violate system guidelines and is therefore as a rule not permissible or does not need to be assumed as given.

Figure 12:
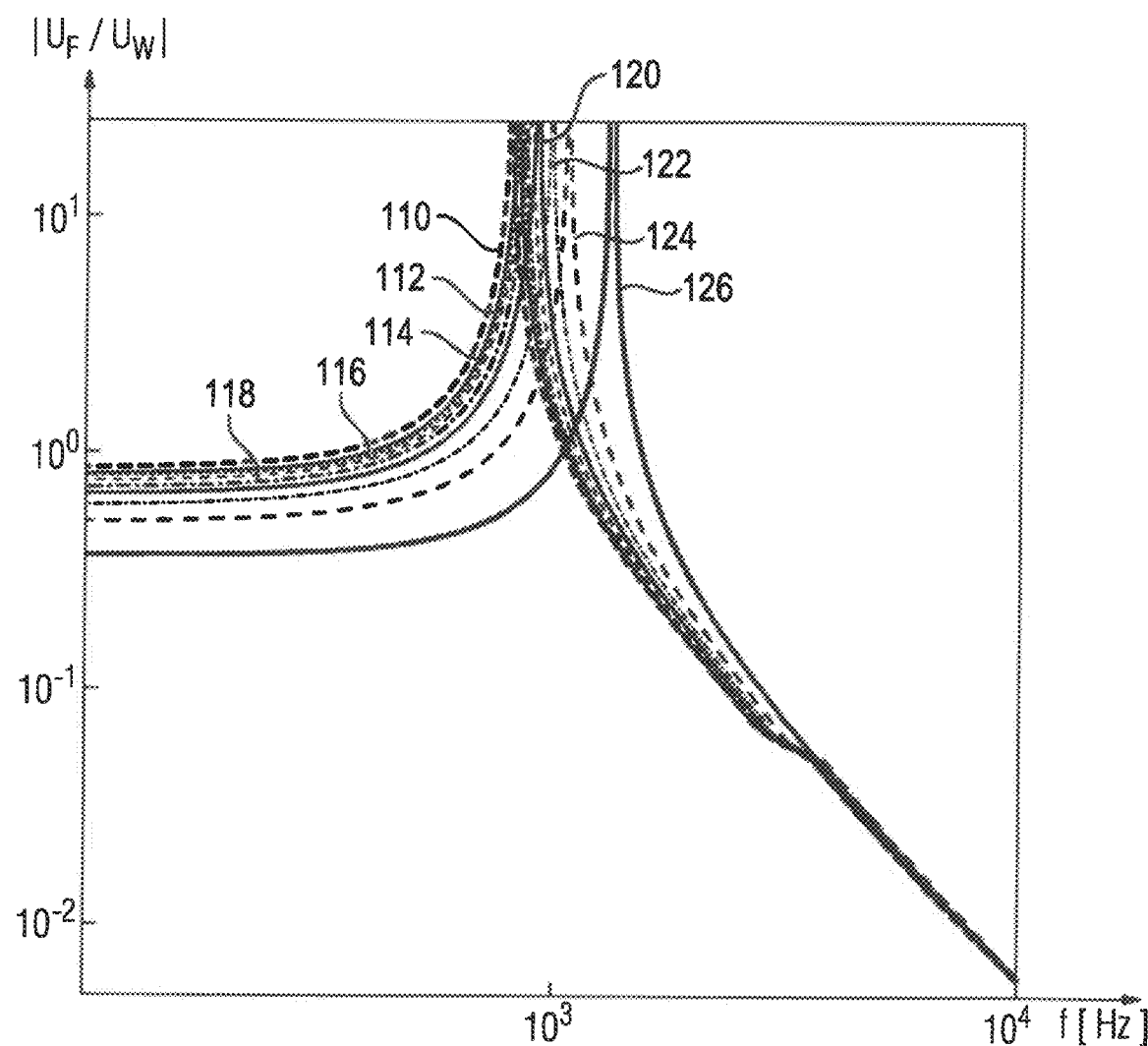

FIG. 12, in a diagram like FIG. 11, shows how a damping with regard to capacitor 82 acts. By contrast with the diagram in accordance with FIG. 11, in the diagram in accordance with FIG. 12 there is now provision for the resistor 84 not to be formed by a short circuit, but to have a resistance value of 0.2Ω. As FIG. 12 shows, this damping in its turn leads to a decoupling of the own LCL filter 10 from the system parameters at higher frequencies, so that the inventive determination of the function of the capacitor 12 is possible in a much-improved manner.

Figure 13:
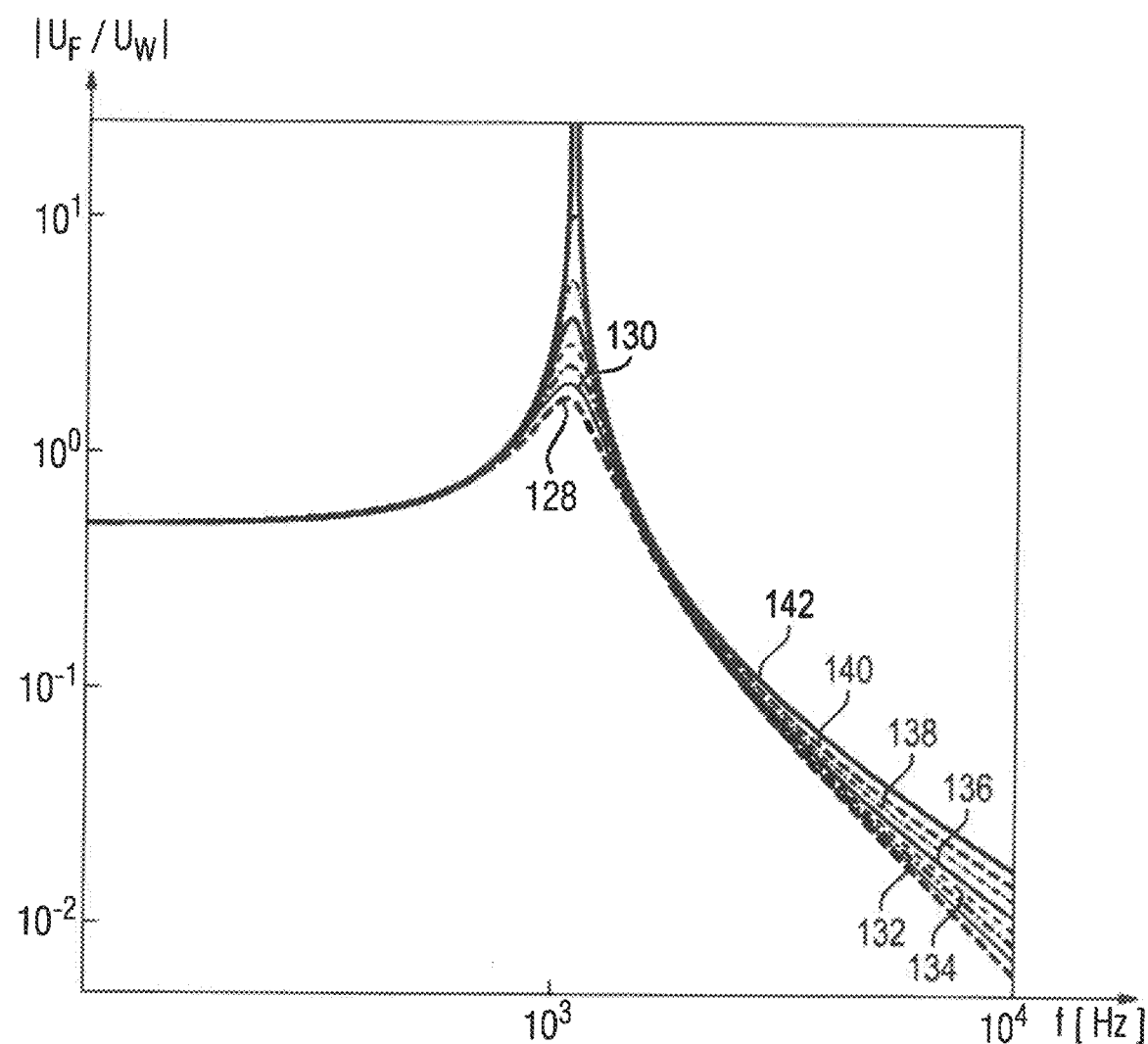

FIG. 13 shows a further schematic diagram like the preceding diagrams in accordance with FIG. 9 to 12, wherein here however the effect of the electrical resistor 54 is to be demonstrated. The parameters are fundamentally selected as explained for FIG. 9, wherein a capacitance value of 600 µF is set for the capacitor 12. The damping values for different resistance values of the resistor 54 are shown by means of graphs 128 to 142. In this case the graph 128 corresponds to a resistance value of 71 mΩ, the graph 130 to a resistance value of 61 mi, the graph 132 to a resistance value of 51 mΩ, the graph 134 to a resistance value of 41 mΩ, the graph 136 to a resistance value of 31 mΩ, the graph 138 to a resistance value of 21 mΩ, the graph 140 to a resistance value of 11 mΩ and the graph 142 to a resistance value of 1 mΩ.

As can be seen from FIG. 13, the resistance value in the determination of the function of the capacitor 12 is possibly not always negligible, however it is known and only fluctuates slightly, so that it can be taken into consideration accordingly if need be.

Taking into consideration the Laplace transformation mentioned above, for sufficiently large values of s, a sufficiently small relationship for usual filter designs is given $$\frac{L_1}{L_{2N}} < \frac{L_1}{L_2}$$

wherein $L_1$ is assigned to the choke 18 and $L_2$ to the choke 20. Assuming a damping resistance trending towards zero a simple approximation for the damping H is produced:

$$H_{UFW1}(s) \approx \frac{1}{s^2 L_1 C_F}$$

This means that an estimated value $\tilde{C}_F$ for the capacitance value of the capacitor 12 can be determined with the aid of the spectral components 26, 28, which correspond to the spectral voltage amplitudes $|U_F(f_a)|$ and $|U_W(f_a)|$, with a sufficiently high measurement or switching frequency $f_a$:

$$\overline{C}_F = \frac{|U_F(f_a)|}{|U_W(f_a)|} \frac{1}{2\pi f_a L_1}$$

In order to improve the measurement accuracy a number of frequency lines or a whole frequency range can be included in the measurement. The estimated value can then be produced for example by forming the average value of a number of individual measurements, as already described above, or also by an optimization by means of a quadratic minimization of an estimated value. It is also conceivable already to undertake the average value formation in the frequency range or in the spectral range. For example, to do this, initially for the spectral components 26, 28 quadratic sums of individual amplitudes in the frequency range or in the spectral range can be computed and subsequently the square root extracted. The following can then apply:

$$\overline{C}_F = \frac{\sqrt{U_F^2(f_n) + U_F^2(f_{n+1}) + \ldots + U_F^2(f_k)}}{\sqrt{U_W^2(f_n) + U_W^2(f_{n+1}) + \ldots + U_W^2(f_k)}} \frac{1}{2\pi \overline{f}_a L_1}$$

with the average frequency value $$\overline{f}_a = \frac{\sum_n^k f_i}{k - n + 1}$$

in the frequency range considered with equidistant individual amplitudes for $f_n = nf_{basis}$ to $f_k = kf_{basis}$ and n<k.

An average value formation in the frequency range is in particular to be recommended if, in the case of a so-called wobbling, the clock rate at the system inverter 16 is changed almost continuously and thus, by contrast with FIG. 7, no separate individual amplitudes can be recognized in the spectrum.

The switching frequency and thus the measurement frequency can be explicitly changed in order to minimize the influence of external interference variables. The timing of the measurement can be synchronized with the change in switching frequency or the clock rate. The change in the frequency components of the connection voltage 22 for a second switching frequency are then to be assigned with high probability to the system inverter 16 and to the effect of the LCL filter 10.

For the computation of the estimated value $\tilde{C}_F$, it is not the absolute voltages but changes in voltage as a result of the switching of the clock rate that are then used. The following then applies $$\tilde{C}_F = \frac{|\Delta U_f(f_a)|}{|\Delta U_W(f_a)|} \frac{1}{2\pi f_a L_1}$$

If the resistance value of the resistor 54 is much greater than zero then this should be taken into consideration in the evaluation. In this case numerical solution methods for equation systems are preferably to be used. Moreover in this case not only should the spectrum of the voltages 22, 24 be evaluated, but also corresponding phase angles should be taken in consideration.

As an alternative there can also be provision for this case for determining, from known device data of the system inverter 16 or through one-off reference measurements, for example during commissioning, maintenance or the like, a reference value, or a reference curve for a frequency response $$\frac{U_F(f)}{U_W(f)}$$

of the system filter and to define a permissible tolerance range or supervision range for the filter effect. When the tolerance range is violated there can then for example be a warning, a shutdown of the system inverter 16 for example or the like.

In order to avoid an immediate shutdown there can also be provision for increasing the clock rate of the system inverter 16 in such a way that, despite the capacitance value of the capacitor 12 being too small, a sufficient damping effect through the LCL filter 10 can still be achieved.

As can be seen from FIG. 11 the supervision system for the capacitor 12 can also be used to recognize impermissible changes in the area of the power supply system 14. This could be for example through the installation of an unsuitable filter in an adjacent connected consumer, a malfunction in an adjacent connected device, an occurrence of critical resonance points in the power supply system 14 through switching processes in the system or system outages or the like.

An alarm message or a reaction of the system inverter 16, which can be output in the case of a capacitance value of the capacitor 12 recognized as impermissible, can explicitly also point to other possible external causes. Where necessary additional measures or measurements for tracing an external error can then be employed. With the aid of the aforementioned variation of the clock rate and the sampling rate however as a rule however a unique distinction can be drawn between a change in the capacitance value of the capacitor 12 or an external influence. The clock rate and/or the sample rate thus basically do not need to be selected as constant for the invention. This can if necessary also be adapted or changed in a suitable way during the inventive conducting of the method.

An external cause, such as for example an external supplementarily connected filter with a defective damping, can generally only lead in a relatively narrow frequency range to overvoltages. With higher and lower measurement frequencies or clock rates on the other hand a sensible estimated value $\tilde{C}_F$ can continue to be determined.

The invention thus makes it possible to avoid expensive measurements in terms of material and manufacturing with regard to a current of a filter capacitor such as the capacitor 12. With the invention only one capacitor voltage measurement for the capacitor 12 is needed as the measurement facility, which frequently is already included in any event in electrical devices of the generic type, in particular system inverters. Thus the function of the capacitor can essentially be realized without additional costs for material and manufacturing. The connection voltage 22 is as a rule likewise already available on the facility side, so that in this regard too no supplementary outlay needs to be necessary.

The invention thus makes it possible to determine the function of the capacitor of a passive filter circuit, and thus also to supervise said function. In this invention use is made of the knowledge that at high frequencies the voltage across the capacitor 12 is definitively defined by the capacitance value of the capacitor 12 and in wide areas is independent of unknown outside influences, in particular through the power supply system 14. A relationship of the spectral components 26, 28 can therefore be used in a suitably high frequency range as a good measure for the estimation of the capacitance value of the capacitor 12. It this case it is further advised, for detection of the voltages, to use sufficiently high sampling rates and preferably to suppress aliasing effects from higher-frequency interference. No separate test signals are needed for the assessment of the capacitance of the capacitor 12.

The aforementioned exemplary embodiments serve exclusively to explain the invention and are not intended to restrict the latter.

What is claimed is:

1. A method for determining a function of a capacitor of a passive filter circuit which reduces line-conducted interferences of an electrical device coupled electrically to a power supply system via the passive filter circuit, said passive filter circuit comprises the capacitor having a predefined capacitance value and a choke having a predefined inductance value, said method comprising:
   detecting an electrical capacitor voltage on the capacitor;
   detecting a connection voltage of the electrical device;
   detecting spectral components of the electrical capacitor voltage and the connection voltage;
   evaluating the spectral components of the electrical capacitor voltage and the connection voltage taking into consideration the inductance value of the choke via a statistical processing operation;
   determining a frequency-dependent damping of the passive filter circuit;
   computing an estimated value for a capacitance value of the capacitor; and
   determining the function of the capacitor from the estimated value.

2. The method of claim 1, wherein the capacitor is coupled at one of its connections to an electrical reference potential and is coupled at another one of its connections to an electrical phase potential.

3. The method of claim 1, further comprising detecting discretized and evaluating digitally the connection voltage and/or the electrical capacitor voltage.

4. The method of claim 1, wherein the evaluating comprises a determination of a capacitance value of the capacitor.

5. The method of claim 4, wherein the evaluating comprises a comparison of the determined capacitance value with a capacitance comparison value.

6. The method of claim 1, wherein only a part of the spectral components above a limit frequency determined by the passive filter circuit is taken into consideration for the evaluating.

7. The method of claim 1, wherein a switching state of a switching element connected in series with the capacitor is determined via the evaluating.

8. The method of claim 1, wherein the electrical device comprises an inverter.

9. The method of claim 1, wherein the passive filter circuit comprises an LCL circuit structure.

10. The method of claim 1, wherein the evaluating comprises anti-aliasing filtering.

11. A determination device for determining a function of a capacitor of a passive filter circuit which reduces line-conducted interferences of an electrical device coupled electrically to a power supply system via the passive filter circuit, said passive filter circuit comprises the capacitor having a predefined capacitance value and a choke having a predefined inductance value, said determination device configured to:
   detect an electrical capacitor voltage on the capacitor;
   detect a connection voltage of the electrical device;
   detect spectral components of the electrical capacitor voltage and the connection voltage;
   evaluate the spectral components of the electrical capacitor voltage and the connection voltage taking into consideration the inductance value of the choke via a statistical processing operation;
   determine a frequency-dependent damping of the passive filter circuit;

compute an estimated value for a capacitance value of the capacitor; and determine the function of the capacitor from the estimated value.

12. An electrical device comprising:
a connection for electrical coupling to a power supply system;
a passive filter circuit connected to the connection and electrically coupling the electrical device to the power supply system, said passive filter circuit configured to reduce line-conducted interferences and comprises the capacitor having a predefined capacitance value and a choke having a predefined inductance value; and
a determination device for determining a function of the capacitor of the passive filter circuit, said determination device configured to:
   detect an electrical capacitor voltage on the capacitor;
   detect a connection voltage of the electrical device;
   detect spectral components of the electrical capacitor voltage and the connection voltage;
   evaluate the spectral components of the electrical capacitor voltage and the connection voltage taking into consideration the inductance value of the choke via a statistical processing operation;
   determine a frequency-dependent damping of the passive filter circuit;
   compute an estimated value for a capacitance value of the capacitor; and
   determine the function of the capacitor from the estimated value.

* * * * *